US 6,711,716 B1

(12) United States Patent
Mueller et al.

(10) Patent No.: US 6,711,716 B1
(45) Date of Patent: Mar. 23, 2004

(54) METAL PROGRAMMABLE CLOCK DISTRIBUTION FOR INTEGRATED CIRCUITS

(75) Inventors: Brian Mueller, Ft. Collins, CO (US); Stacey Secatch, Ft. Collins, CO (US); James Hansen, Loveland, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/255,285

(22) Filed: Sep. 26, 2002

(51) Int. Cl.[7] .............................................. G06F 17/50
(52) U.S. Cl. ................................... 716/1; 716/5; 716/6
(58) Field of Search ....................................... 716/1–18

(56) References Cited

U.S. PATENT DOCUMENTS

| | | | | |
|---|---|---|---|---|
| 5,691,662 A | * | 11/1997 | Soboleski et al. | 327/292 |
| 5,849,610 A | * | 12/1998 | Zhu | 438/129 |
| 5,887,002 A | * | 3/1999 | Cooke et al. | 714/725 |
| 5,912,820 A | | 6/1999 | Kerzman et al. | 364/489 |
| 6,513,149 B1 | * | 1/2003 | Donato | 716/12 |

* cited by examiner

Primary Examiner—Vuthe Siek (57) ABSTRACT

A method for allowing in-place programming of clock buffer delays of clock buffers in an integrated circuit clock tree is presented. The clock tree comprises at least one clock driver connected between a clock driver input line and a clock driver output line. Each clock driver comprises a plurality of clock buffers connected in series between the clock driver input line and, potentially, the clock driver output line. Metal is reserved in intervening metal layers within a clock driver block between the clock driver input line and the input of a first one of said plurality of clock buffers in the variable clock buffer chain. Metal is reserved on one or more metal layers for connecting the output of each of the clock buffers in the clock buffer chain to the clock driver output line. The metal layers are partitioned into one or more programming layers and one or more non-programming layers. Then, for each clock buffer in the clock buffer chain, an output connection route is mapped between the output of the respective clock buffer to the clock driver output line through the plurality of metal layers. Metal corresponding to the output connection route is then implemented on each of said non-programming layers. During design, a desired clock driver delay for the clock driver is determined. Metal corresponding to the output connection route on each of said programming layers to connect the output of the clock buffer corresponding to the desired delay to the clock driver output line.

20 Claims, 6 Drawing Sheets

METAL PROGRAMMABLE CLOCK DISTRIBUTION FOR INTEGRATED CIRCUITS

FIELD OF THE INVENTION

The present invention pertains generally to clock trees in integrated circuits, and more particularly, to a metal programmable clock distribution scheme for allowing in-place programming of clock buffer delays.

BACKGROUND OF THE INVENTION

Clock networks on CMOS integrated circuits have long been a source of difficulty to integrated circuit designers due to the importance of minimizing skew between clock inputs. A typical integrated circuit includes a clock tree which distributes one or more clock signals throughout the chip to clocked elements. A primary goal of a clock tree is to minimize clock skew between clocked elements. Since all clocked elements on a given tree are driven from one net with a clock spine, skew is caused by differing interconnect lengths and loads.

Clock skew represents a fraction of the clock period that cannot be used for computation. For example, a clock skew of 500 ps with a 200 MHz clock means that 500 ps of every 5 ns clock cycle, or 10 percent of the performance is wasted. Accordingly, clock skew may reduce the effective time allowed for certain logic paths within the design, and thus may reduce the effective maximum frequency, and therefore performance, of the design.

In addition, clock skew may have a number of other detrimental effects on the performance of a circuit design. For example, clock skew may cause hold time violations when only a small amount of logic is provided between registers, causing malfunction of the circuit. Further, clock skew may cause communication problems between integrated circuits. It should be recognized that these are only illustrative examples of effects that clock skew may have on a system.

For the above reasons, a primary goal of a clock tree is to minimize clock skew between clocked elements.

Clock trees may be balanced or unbalanced. Balanced clock trees distribute a number of clock drivers symmetrically and evenly placed on the integrated circuit die. In a balanced tree, the distance between each clock driver and its receiving element is preferably identical, and the load on each driver is matched. Balanced clock trees find suitable application in integrated circuits that are formed with functional blocks characterized by substantially similar loads, for example, memory chips formed with symmetrically balanced memory arrays.

By contrast, unbalanced clock trees distribute clock drivers in a non-symmetrical manner throughout the integrated circuit, generally with higher concentrations of clock drivers where the load is larger and lower concentrations of clock drivers where the load is smaller. Unbalanced clock trees are often utilized in complex circuits that are designed in a functionally hierarchical manner using a plurality of different functional blocks of differing loads. Unbalanced clock trees are typically used in integrated circuits that are partitioned into different functional blocks (which are often designed by different groups of designers).

In an integrated circuit design having a balanced clock tree, the clock network is typically pre-placed on the integrated circuit die prior to placement of functional logic blocks. This scheme has a number of limitations. First, the clock buffering circuit may interfere with ideal block placement on the chip. This means that area or timing may need to be sacrificed. Second, any smaller blocks than the average will have a larger clock driver than is needed, possibly increasing the amount of power required. This scheme may waste chip resources.

In an integrated circuit design having an unbalanced clock tree, the clock network is normally added after determining where the appropriate buffers need to be located. This scheme also has a number of limitations. First, it prevents simulation of the clock network until all layers of the hierarchy are complete. This means that a parent block made up of one or more children blocks cannot be simulated until all of its children blocks are complete. As a result, the entire design must be complete before simulation can occur. If, as a result of simulation, it is discovered that one or more clock routes must be adjusted to meet the clock skew requirements, the final artwork is delayed until the layer(s) requiring adjustment are reworked, and the entire adjusted artwork is resimulated. This scheme is clearly time-consuming and costly.

Accordingly, a need exists for a clock distribution scheme that combines the advantages, and reduces the disadvantages, of both the balanced and unbalanced clock trees. In particular, a need exists for allowing clock drivers to be pre-placed where likely to be needed. The pre-placement allows simulation of various hierarchical levels without requiring all levels of artwork to be completed. A need also exists for allowing in-place programming of clock driver delays on a driver-by-driver basis without disturbing the clock tree.

SUMMARY OF THE INVENTION

The present invention is a metal programmable clock distribution scheme for allowing in-place programming of clock driver delays on a driver-by-driver basis. In accordance with a preferred embodiment of the invention, the clock network is pre-placed at the top level of the functional hierarchy. The clock network comprises a plurality of instances of clock drivers each comprising clock buffer chains in locations where it is expected that a clock driver may be needed. Each clock buffer chain comprises a plurality of unit delay clock buffers connected in series between the respective clock driver input line and, potentially, the respective clock driver output line. Designers reserve clock driver input metal on each of the plurality of metal layers between the clock driver input line and the input of the first clock buffer in the clock buffer chain. For each clock buffer in a given clock buffer chain, designers also reserve clock driver output metal on each of the metal layers between the output of each of respective clock buffer in the clock buffer chain to the clock driver output line.

The metal layers between the clock driver output line and the outputs of the individual clock buffers in the clock buffer chain of a given clock driver are partitioned into one or more programming layers and one or more non-programming layers. For the purposes of this invention, the term "non-programming layer" refers to a metal layer in which the routing of metal, once initially determined, remains fixed within a given clock driver block regardless of changes to the delay of the clock driver. The term "programming layer" refers to a metal layer in which the routing of metal within a given clock driver block may change due to changes to the delay of the clock driver.

Then, for each clock buffer in the clock buffer chain, an output connection route is mapped between the output of the respective clock buffer in the clock buffer chain of the clock driver to the clock driver output line through the reserved clock driver output metal on each of the one or more metal layers that lie between the output of each of respective clock buffer in the clock buffer chain and the clock driver output line. Metal is then implemented along a route corresponding to the output connection route for each of the non-programming layers.

During design, a desired clock driver delay for each clock tree branch is determined. Metal is then implemented along a route corresponding to the output connection route on each of the one or more programming layers in order to complete the output connection route between the output of the clock buffer corresponding to the desired delay and the clock driver output line.

Once the location of a given clock driver is decided, the location of the clock driver remains static throughout the remaining design process. The connections of the individual clock buffers in the clock buffer chain of the clock driver are preferably programmable using a single programmable layer (e.g., metal M4). Accordingly, metal within the clock driver block is reserved and implemented in each of the layers M2 and M3 for potential output line connection from the output of each unit delay buffer in the clock buffer chain of the clock driver. Once the desired clock driver delay is determined, metal layer M4 is implemented to program and complete the connection between the output of the clock buffer in the clock buffer chain that will result in the desired clock driver delay and the clock driver output line. The input of the subsequent clock buffer in the chain, if it exists, is preferably also programmably connected to a static line of the integrated circuit such as ground using the programmable layer M4.

The invention affords several advantages over the prior art. First, the delay of the clock drivers in the top level functional block are programmed by changing preferably only a single or small few metal mask(s). Thus, clock skew modifications can be achieved orthogonal to the top level routing by simply executing a metal mask turn in the one or more programming layers. Accordingly, top level simulation does not depend on top level clock routing, since the top level clock routing remains unchanged. Thus, top level artwork builds do not depend on top level clock distribution, as was normally the case in the prior art, and therefore no rerouting is required. This approach allows designers to change the clock driver delays late in the design process, or to fix any skew problems discovered after the artwork is manufactured, by changing only the metal mask of the programming layers.

Second, the present invention allows 'in place' tuning on a clock-driver-by-clock-driver basis. This approach allows the clock drivers to be implemented ahead of time and to be changed without affecting the design/artwork of the top level.

BRIEF DESCRIPTION OF THE DRAWING

The invention will be better understood from a reading of the following detailed description taken in conjunction with the drawing in which like reference designators are used to designate like elements, and in which.

DETAILED DESCRIPTION

A novel method for allowing in-place programming of clock buffer delays of clock buffer chains of a clock tree is described in detail hereinafter. Although the invention is described in terms of specific illustrative embodiments, it is to be understood that the embodiments described herein are by way of example only and that the scope of the invention is not intended to be limited thereby.

Turning now to the invention, the invention is illustrated in a functionally hierarchical integrated circuit design wherein the functionality of the chip is partitioned into different functional blocks located on different functionality levels. In this common integrated circuit design approach, system designers design and internally arrange the integrated circuit according to hierarchical levels of functionality. According to this methodology, system designers partition the overall design into a number of blocks, wherein each of the blocks performs a dedicated function. Blocks are likewise partitioned into sub-blocks, each of which performs a smaller dedicated function. Partitioning is typically continued until the size of each of the sub-blocks is of a manageable size. A specification for each of the sub-blocks is then written to define the function, timing and power requirements thereof. Often, many levels of functional hierarchy are implemented in an integrated circuit.

In an hierarchical design such as that used in functional partitioning, blocks, sub-blocks, sub-sub-blocks, and so on, are arranged in a functional hierarchy. Thus, a given integrated circuit may include a number of levels of a functional hierarchy, including a first (or top) level which defines one or more first level functional blocks. Each first level functional block may include within its boundaries a number of second level sub-blocks which are positioned at the next lower level in the functional hierarchy. A higher level block is typically called the parent of each of its next lower level sub-blocks. Likewise, the lower level sub-blocks are typically called the children of the corresponding higher level block. The lowest level in the design hierarchy of the integrated circuit typically includes only basic circuit components (e.g. leaf cells).

Figure 1:
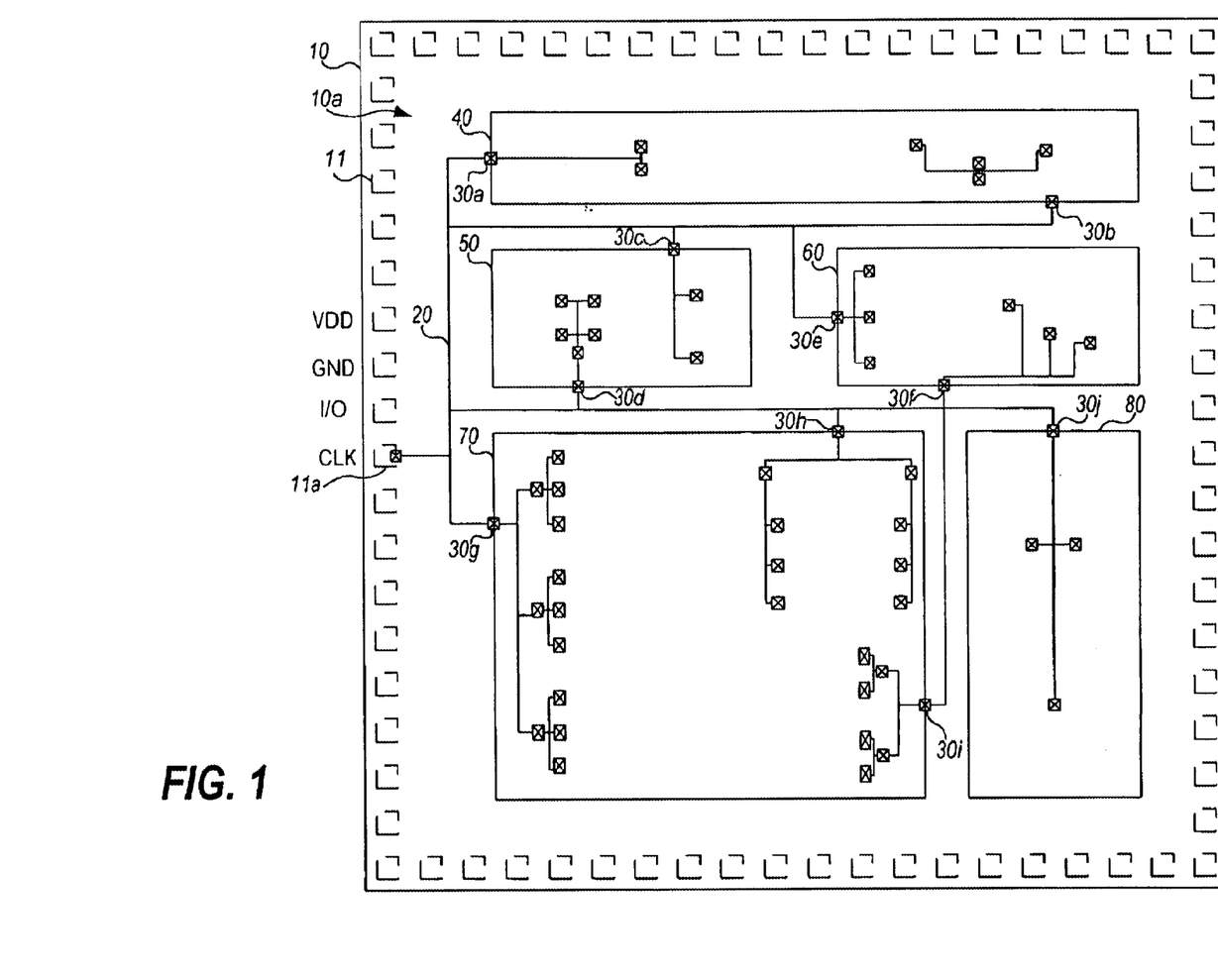
FIG. 1 is a plan view of a top level of the functional hierarchy of an illustrative integrated circuit.
Figure 2:
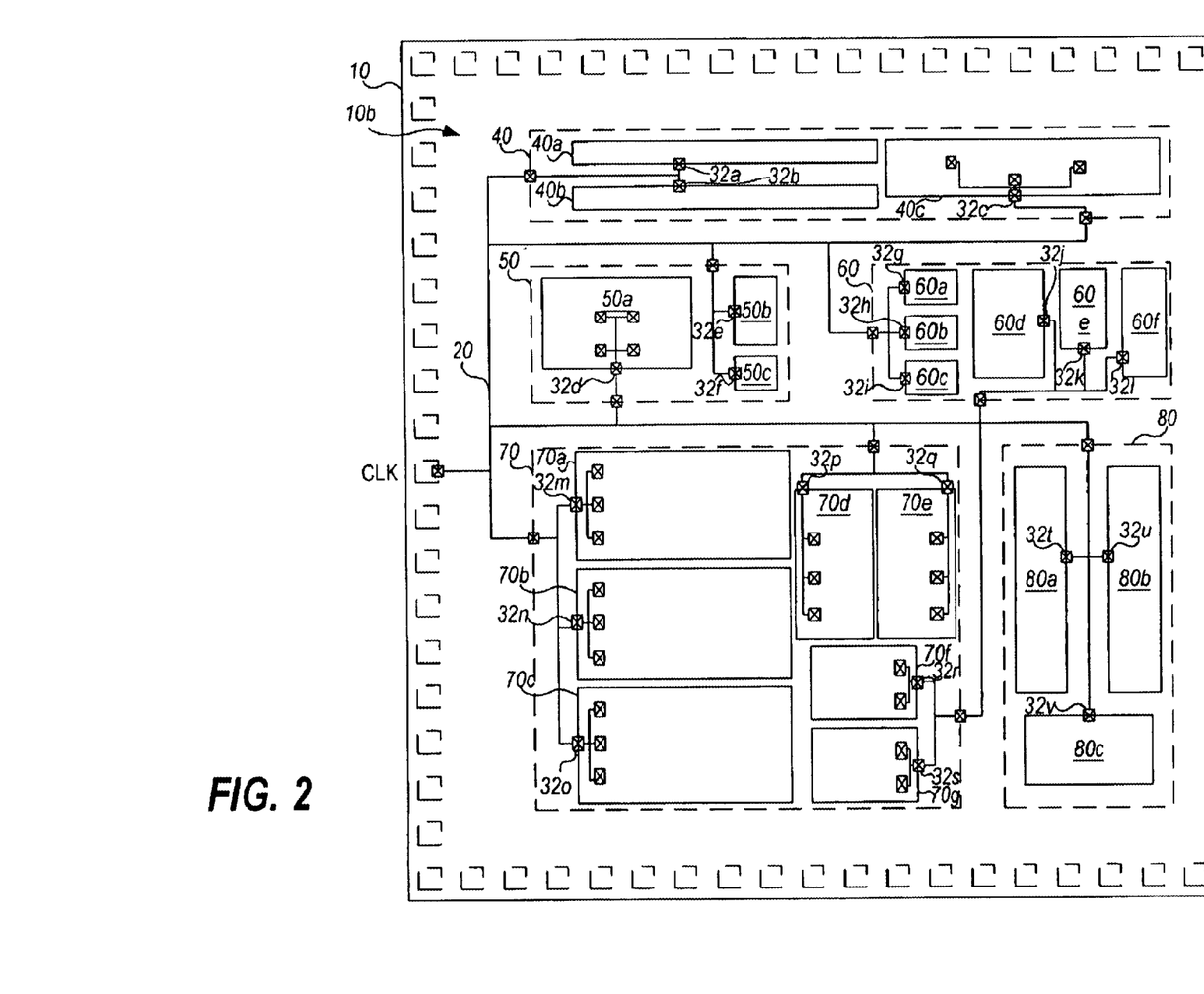
FIG. 2 is a plan view of a second-from-top level of the functional hierarchy of the illustrative integrated circuit of FIG. 1.
Figure 3:
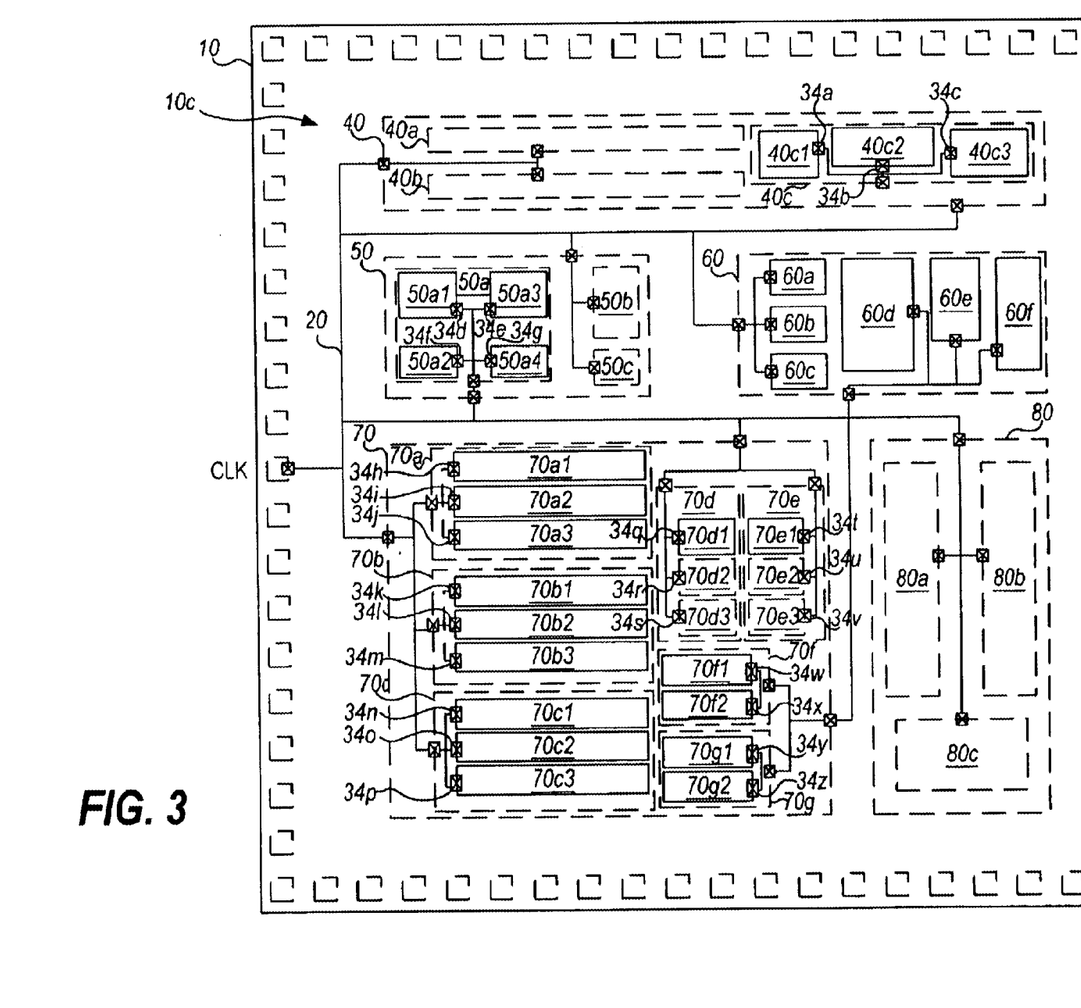
FIG. 3 is a plan view of a third-from-top level of the functional hierarchy of the illustrative integrated circuit of FIGS. 1 and 2.

FIGS. 1, 2, and 3 illustrate three different levels of a functional hierarchy of an illustrative integrated circuit 10. As shown in FIG. 1, the functionality of the chip is partitioned at a top (first) level 10a into a number of functional blocks 40, 50, 60, 70, and 80. Each of functional blocks 40, 50, 60, 70, and 80 are partitioned at a second-from-top (second) level 10b into respective sub-blocks 40a–40c, 50a–50c, 60a–60f, 70a–70g, and 80a–80c, as shown in FIG. 2. At the next-lower level (third level) 10c shown in FIG. 3, the sub-blocks 40a–40c, 50a–50c, 60a–60f, 70a–70g, and 80a–80c may be further partitioned into sub-sub-blocks $40c_1$, $40c_2$, $40c_3$, $50a_1$, $50a_2$, $50a_3$, $50a_4$, $70a_1$, $70a_2$, $70a_3$, $70b_1$, $70b_2$, $70b_3$, $70c_1$, $70c_2$, $70c_3$, $70d_1$, $70d_2$, $70d_3$, $70e_2$, $70e_3$, $70f_1$, $70f_2$, $70g_1$; $70g_2$. Of course, in a functional hierarchy, a typical integrated circuit may include many more functional levels; however, for brevity, the discussion will be limited to three levels of hierarchy.

As also shown in FIG. 1, power, communication, and externally generated clock signals are transferred between the integrated circuit 10 and the outside world via chip pads 11. After the layout of the functional blocks is determined during the floorplanning stage of design, the power, ground, communication, and clock tree channels are each laid out. For simplification of illustration, the power, ground, and communication channels are left out of the floor plan view in FIGS. 2, 3, and 4.

The integrated circuit 10 typically includes a clock tree 20. The clock tree distributes one or more clock signals throughout the chip. A primary goal of a clock tree 20 is to minimize clock skew between clocked elements.

To minimize clock skew, typical clock trees include a number of clock drivers that are strategically placed on the integrated circuit to drive matched loads. There may be a number of first level drivers 30a–30j (FIG. 1), which may receive a clock signal from an input pad 11a. Each of the first level drivers 30a–30k may drive a number of second level drivers 32a–32v (FIG. 2). Each of the second level drivers 32a–32v may drive a number of third level drivers 34a–34z (FIG. 3). A typical clock tree may include a number of levels of clock drivers; however, as described previously, the number of hierarchical levels is limited to three in this discussion.

Figure 4:
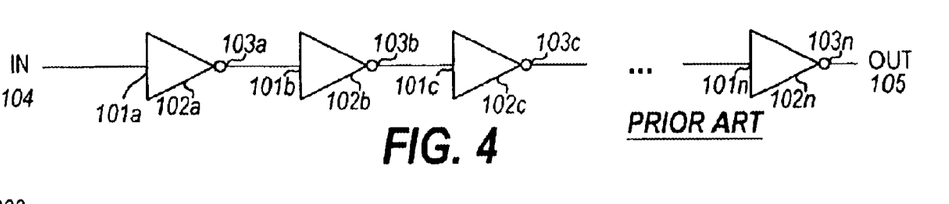
FIG. 4 is a schematic block diagram of a prior art clock buffer chain.

FIG. 4 is a schematic block diagram of a prior art clock driver circuit 100. As illustrated, a clock driver circuit 100 may be implemented as a clock buffer chain comprising a plurality of unit delay clock buffers 102a–102n connected in series. In particular, the clock driver driving signal IN 104 drives the input 101a of the first clock buffer 102a, which presents a delayed version IN(t–1) of the driving signal IN(t) 104 at its output 103a. The output 103a of the first clock buffer 102a is connected to the input 101b of the second clock buffer 102b, which presents a delayed version of its input signal at its output 103b. Thus the signal presented on the output 103b is a delayed version IN(t–2) (by 2 unit delays) of driving signal IN(t) 104. The output of each clock buffer 102a–102n–1 is connected directly to the input of its respective succeeding clock buffer 102a+1–102n. The output 103n of the last clock buffer in the chain is connected to the clock driver output line OUT 105. Thus, the signal on the output line OUT 105 is a delayed version of the clock driver driving signal IN 104, delayed by as many unit delays as there are clock buffers 102a–102n in the clock buffer chain (i.e., n unit delays) or, OUT(t)=IN (t–n).

With the above-described prior art clock buffer, the delay of the clock driver is fixed and therefore cannot be changed without changing the artwork on several levels. Accordingly, great care must be taken in choosing the correct delay values prior to implementation. Along these lines, prior art techniques balance the clock tree to ensure near-identical interconnect lengths and driving loads. Designing and constructing a clock tree is therefore often a time-consuming task, requiring significant design resources.

The present invention uses a novel technique which allows pre-placement of a clock driver (e.g., in the top-level clock tree), yet allows the clock driver delays to be programmed in-place and therefore changed even after top-level artwork is complete. In accordance with a preferred embodiment of the invention, the clock network is pre-placed at the top level of the functional hierarchy. The clock network comprises a plurality of instances of clock drivers pre-placed in locations where it is expected that a clock driver may be needed.

Preferably, each of the clock drivers in the clock network is a metal programmable clock driver implemented in accordance with the invention. A metal programmable clock driver implemented in accordance with the invention preferably comprises a variable clock buffer chain that is programmable via one or more metal programming layers associated with the clock driver. Within a given clock driver block on an integrated circuit, the metal layers situated between the clock driver output line and the outputs of the individual clock buffers in the clock buffer chain of the clock driver are partitioned into one or more programming layers and one or more non-programming layers. A metal layer in which the routing of metal within the clock driver block of that layer, once initially determined, shall remain fixed within the clock driver block regardless of changes to the delay of the clock driver is designated as a "non-programming layer". A metal layer in which the routing of metal within the clock driver block of that layer may change due to changes to the delay of the clock driver is designated a "programming layer".

Designers reserve clock driver input metal on each of the plurality of metal layers (within the clock driver block) between the clock driver input line and the input of the first clock buffer in the clock buffer chain. For each clock buffer in the clock buffer chain, designers also reserve clock driver output metal (within the clock driver block) on each of the metal layers between the output of each of respective clock buffer in the clock buffer chain to the clock driver output line.

The connection from the output of only one buffer in the chain is completed using the programming layer(s). Then, during design of lower-level functional blocks, the output of an appropriate clock buffer within a given clock buffer chain associated with a given lower-level functional block is connected to the clock input of a lower level functional block. (The appropriate number of unit clock buffers needed to achieve the desired delay is determined by simulation of the top level clock network, taking into account the loading, interconnect parameters (e.g., characteristic impedance) of the trace, and circuit model of each lower level functional block).

Figure 5:
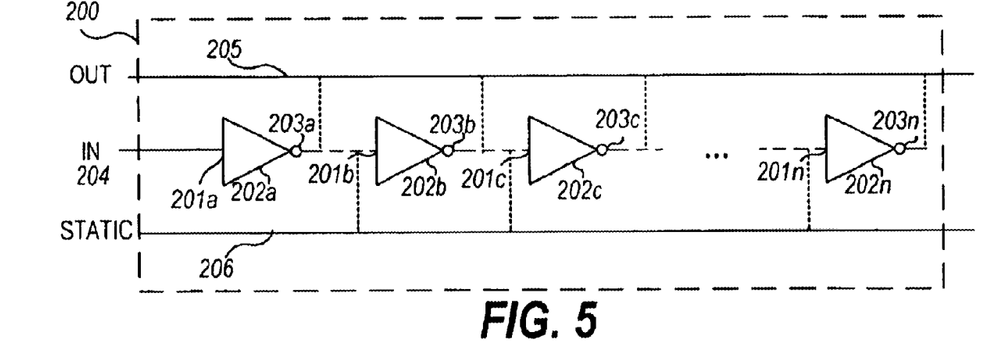
FIG. 5 is a schematic block diagram of a metal programmable clock driver implemented in accordance with the invention prior to programming.

FIG. 5 is a schematic block diagram of a variable clock buffer chain 200 used to implement the clock drivers 30a–30j; 32a–32v; 34a–34z in accordance with the invention. The variable clock buffer chain 200 is shown prior to programming. As illustrated, the variable clock buffer chain 200 is implemented with a plurality of unit delay clock buffers 202a–202n connectable in series. In particular, the clock driver driving signal IN 204 drives the input 201a of the first clock buffer 202a, which presents a delayed version IN(t–1) of the driving signal IN(t) 204 at its output 203a. The output 203a of the first clock buffer 202a is connectable to the input 201b of the second clock buffer 202b, which, if connected, presents a delayed version IN(t–2) of its input signal at its output 203b. The output of each clock buffer 202a–202n–1 is connectable directly to the input of its respective succeeding clock buffer 202a+1–202n, such that, if the variable clock buffer chain is programmed to its maximum delay, the output 203n is a delayed version IN(t–n) of the clock driver driving signal IN 204, delayed by as many (n) unit delays as there are clock buffers 202a–202n in the clock buffer chain. The clock driver 200 is made programmable because the outputs of each of the clock buffers 202a–202n are connectable (via one or more programming layers, discussed hereinafter) to the output line OUT 205. In the preferred embodiment, the inputs 201b–201n of each clock buffer 202b–202n are also connectable to a static line to prevent noise on the unused buffer outputs and to prevent unnecessary dissipation of power.

Figure 6:
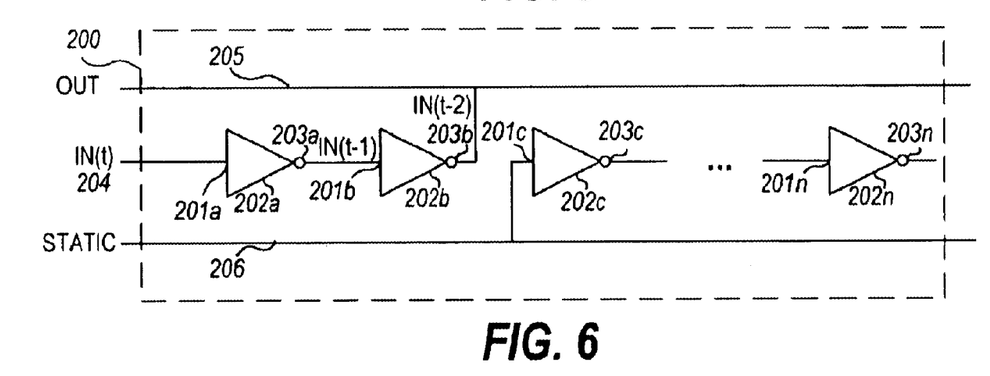
FIG. 6 is a schematic block diagram of the metal programmable clock driver of FIG. 5 with the clock delay programmed to three unit delays as an illustrative example.

FIG. 6 is a schematic block diagram of the variable clock buffer chain of FIG. 5 with the clock buffer chain delay programmed to two unit delays as an illustrative example. As illustrated, the output 203b of clock buffer 202b is connected (via a metal mask as hereinafter described) to the output line OUT 205. The outputs 203c–203n of all subsequent clock buffers 202c–202n remain unconnected from the output line OUT 205. Preferably, the input 201c–201n of each subsequent clock buffer 202c–202n is connected to a static line STATIC 206 to prevent noise on the unused buffer outputs and to prevent unnecessary dissipation of power. In the alternative, the input 201c of the first subsequent clock buffer 202c is connected to a static line STATIC 206, and the outputs 203c–203n−1 are respectively connected to the input 201d–201n of the next subsequent clock buffer 202d–201 n in the clock buffer chain 200. With the illustrated programmed configuration, the input signal IN 204 travels through two unit delays generated by clock buffers 202a and 202b, where the delayed signal IN(t−2) is presented at the output OUT 205. With different programming, any desired number of unit delays can be achieved simply by connecting the output of the clock buffer corresponding to the desired number of unit delays to the output line OUT 205.

The variable clock buffer chain 200 is made programmable through the use of programming metal layer(s). In the preferred embodiment, a single metal layer, specifically M4, is used as the programming metal layer. Designers reserve clock driver input metal on each of the plurality of non-programming metal layers M1–M3 between the clock driver input line IN 204 and the input 201a of the first clock buffer 202a in the variable clock buffer chain 200. For each clock buffer 202a–202n in the variable clock buffer chain 200, designers also reserve clock driver output metal on each of the metal layers between the output 203a–203n of each of the respective clock buffers 202a–202n in the variable clock buffer chain 200 to the clock driver output line OUT 205.

Then, for each clock buffer 202a–202n in the clock buffer chain 200, an output connection route is mapped between the output 203a–203n of the respective clock buffer 202a–202n to the clock driver output line OUT 205 through the non-programming metal layers M1–M3. Metal M1a–M3a, M1b–M3b, M1d–M3d, M1f–M3f, M1h–M3h, M1j–M3j, corresponding to the output connection route is then implemented on each of the non-programming layers M1–M3. During design, a desired clock driver delay for the clock driver is determined.

The programming metal layer(s) (e.g., M4) is the layer(s) that determines the delay of the clock driver. In particular, buffer-to-buffer serial connections are implemented in the programming layer(s), along with the connection between the output of an appropriate block buffer in the chain to the output line. Connections between the inputs of unused clock buffers and a static line on the integrated circuit may also be implemented on the programming layer(s).

Figure 7:
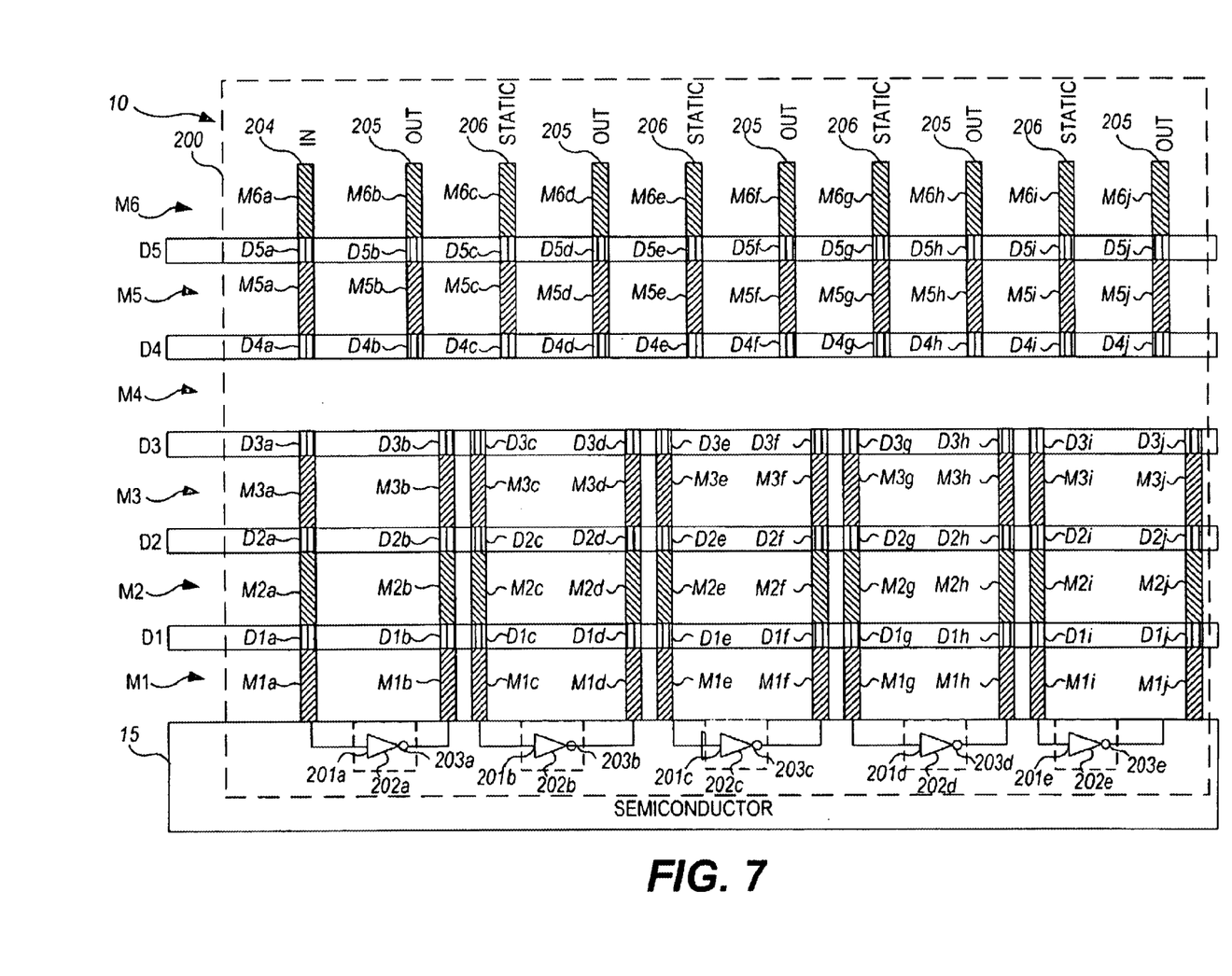
FIG. 7 is a cross-sectional view of a portion of an integrated circuit illustrating the metal programmable clock driver of FIG. 5 prior to programming.

This is illustrated in FIG. 7, which shows a cross-sectional side view of a portion of the integrated circuit 10 including a programmable clock driver block in which the variable clock buffer chain 200 of the clock driver of FIG. 4 is implemented. As illustrated, the individual clock buffers of the chain 200 are implemented in the semiconductor substrate 15, and their locations remain static within the clock driver block throughout the remaining design process.

The integrated circuit 10 comprises a plurality of metal layers M1–M6 layered over a semiconductor substrate 15 and separated by interlaid dielectric layers D1–D5. Connections are made between layers using conductive vias D1a–D1j, D2a–D2j, D3a–D3j, D4a–D4j, D5a–D5j, formed in intervening dielectric layers D1–D5. In the context of the present invention, the integrated circuit is designed in a functionally hierarchical manner. To this end, the lowest-level connectivity is typically implemented on the lower layers, and the highest-level connectivity is implemented on the upper layers.

In the illustrative embodiment, metal layer M4 is designated as the programming layer. Accordingly, top-level connections (typically implemented on metal layers M5 and M6) to the input and output of the clock driver must connect to layer M4; likewise, the variable clock buffer chain connections (e.g., buffer-to-buffer connections, the single buffer-output-to-output-line connection, and buffer-input-to-static-line connections) are completed at layer M4.

In the illustrative embodiment, metal layers M1–M3 lie between the outputs of the clock buffers 202a–202e and their routing of metal inside the clock buffer block, once initially determined, remains fixed within the clock driver block regardless of changes to the delay of the clock driver. Accordingly, metal layers M1–M3 are designated as the non-programming layers in the illustrative embodiment.

For each clock buffer 202a–202e in the clock buffer chain 200, an output connection route is mapped and implemented between the output 203a–203e of the respective clock buffer 202a–202e in the clock buffer chain 200 of the clock driver to the clock driver output line OUT 205 through the non-programming layers M1–M3 within the clock driver block. In other words, metal is implemented in each of non-programming layers M1–M3 (including interlayer vias) to connect the output 203a–203e of each clock buffer 202a–202e to programming layer M4. Metal on programming layer M4 is selectively implemented to complete the desired connections within the driver to achieve the desired clock driver delay.

Accordingly, as illustrated in FIG. 7, metal M1b, M2b, M3b is implemented on respective layers M1, M2, and M3 (with connecting vias D1b, D2b, D3b therebetween) to form a continuous interconnect between the output 203a of clock buffer 202a and layer M4. A connection between the output 203a of clock buffer 202a and the output line 205 OUT can only be completed if metal in metal layer M4 is implemented to connect via D3b to output line OUT 205 (for example, connecting to via D4b).

Similarly, metal M1d, M2d, M3d is implemented on respective layers M1, M2, and M3 (with connecting vias D1d, D2d, D3d therebetween) to form a continuous interconnect between the output 203b of clock buffer 202b and layer M4. A connection between the output 203b of clock buffer 202b and the output line 205 OUT can only be completed if metal in metal layer M4 is implemented to connect via D3d to output line OUT 205 (for example, connecting to via D4d).

Metal M1f, M2f, M3f is implemented on respective layers M1, M2, and M3 (with connecting vias D1f, D2f, D3f therebetween) to form a continuous interconnect between the output 203c of clock buffer 202c and layer M4. A connection between the output 203c of clock buffer 202c and the output line 205 OUT can only be completed if metal in metal layer M4 is implemented to connect via D3f to output line OUT 205 (for example, connecting to via D4f).

Metal M1h, M2h, M3h is implemented on respective layers M1, M2, and M3 (with connecting vias D1h, D2h, D3h therebetween) to form a continuous interconnect between the output 203c of clock buffer 202c and layer M4. A connection between the output 203d of clock buffer 202d and the output line 205 OUT can only be completed if metal in metal layer M4 is implemented to connect via D3h to output line OUT 205 (for example, connecting to via D4h).

Metal M1j, M2j, M3j is implemented on respective layers M1, M2, and M3 (with connecting vias D1j, D2j, D3j therebetween) to form a continuous interconnect between the output 203e of clock buffer 202e and layer M4. A connection between the output 203e of clock buffer 202e and the output line 205 OUT can only be completed if metal in metal layer M4 is implemented to connect via D3j to output line OUT 205 (for example, connecting to via D4j).

Figure 8:
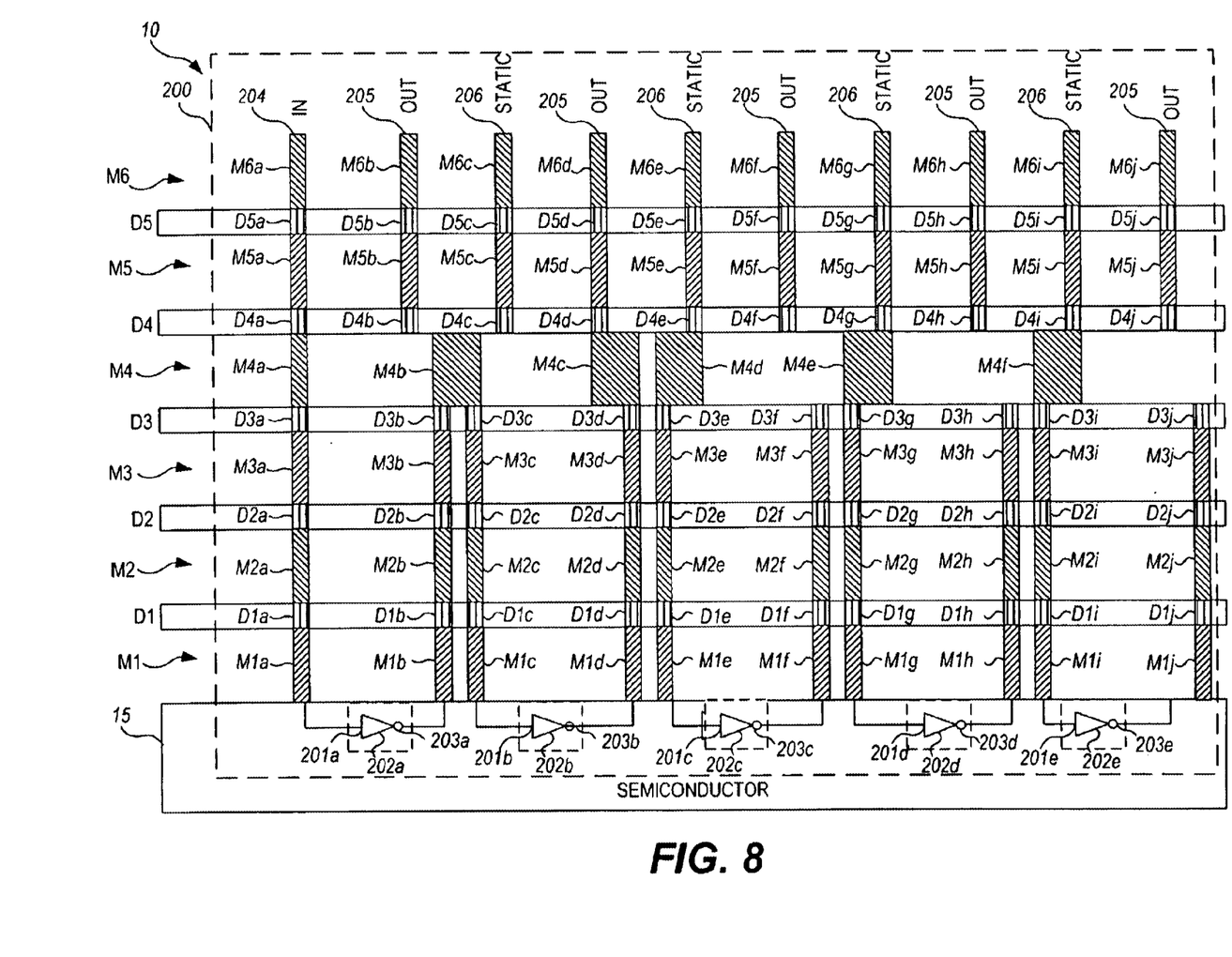
FIG. 8 is a cross-sectional side view of an integrated circuit illustrating the metal programmable clock driver of FIG. 6 with the clock delay programmed to three unit delays.

In a single revision of metal mask M4, the programmable clock buffer 200 can be programmed to set the delay of the clock buffer from one unit delay to a number of unit delays corresponding to the maximum number of clock buffers in the variable clock chain. This is illustrated in FIG. 8, where the variable clock buffer chain comprises five clock buffers 202a–202e, thereby allowing the clock delay of the driver to vary from one unit delay to five unit delays through programming of metal mask M4. As illustrated, metal mask M4 implements metal M4c, forming a connection between metal M3d in metal layer M3 (through via D3d) and metal M5d in metal layer M5 (through via D5d), and thereby completing the connection between the output 203b of clock buffer 202b and the output line OUT 205. Metal mask M4 also implements metal M4a, forming a connection between input line 204 at via D4a and the clock driver input route at D3a (which connects to the input 201a of buffer 202a through metal M3a, via D2a, metal M2a, via D1a, and metal M1a. Metal mask M4 also implements metal M4b, forming a connection between the output 203a of first buffer 202a and the input 201b of the second buffer 202b, thereby completing the series connection of buffers 202a and 202b.

Note that M4c forms the only connection to the output line OUT 205; accordingly, the delay between the input line 204 IN of the programmable clock buffer 200 and the output line OUT 205 is two unit delays (since the signal must pass through two unit delay buffers 202a and 202b). The remaining clock buffers 202c, 202d and 202e are unconnected from the clock buffer chain. In the preferred embodiment, the input of each remaining unconnected clock buffer 202c, 202d and 202e is connected to a static line 206 STATIC. This is accomplished using the same programming technique as used to program the desired delay—namely by using the programming metal layer(s), e.g., metal layer M4, to form the final connection between the input 201c–201e of the respective remaining unconnected clock buffers 202c–202e and the static line 206 STATIC. Accordingly, in the illustrative example, the input 201c of unconnected buffer 202c is connected to the static line 206 STATIC through programmed metal M4d, which connects path M1e, D1e, M2e, D2e, M3e, D3e, to the static line STATIC 206 at via D4e. Similarly, the input 201d of unconnected buffer 202d is connected to the static line 206 STATIC through programmed metal M4e, which connects path M1g, D1g, M2g, D2g, M3g, D3g, to the static line STATIC 206 at via D4g, and the input 201e of unconnected buffer 202e is connected to the static line 206 STATIC through programmed metal M4f, which connects path M1i, D1i, M2i, D2i, M3i, D3i, to the static line STATIC 206 at via D4i.

As is clear from the above description, the advantages of the present invention over the prior art are many. First, the delay of the clock drivers in the top level functional block are programmed by changing preferably only a single or small few lower level metal mask(s). Thus, clock skew modifications can be achieved orthogonal to the top level routing by simply executing a metal mask turn in the one or more programming layers. Accordingly, top level simulation does not depend on top level clock routing, since the top level clock routing remains unchanged. Thus, top level artwork builds do not depend on top level clock distribution, as was normally the case in the prior art, and no rerouting is required. This approach allows designers to change the clock driver delays late in the design process, or to fix any skew problems discovered after the artwork is manufactured, by changing only the metal mask of the programming layers.

Second, the present invention allows 'in place' tuning on a clock-driver-by-clock-driver basis. This approach allows the clock drivers to be implemented ahead of time and to be changed without affecting the design/artwork of the top level.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A method for allowing in-place programming of clock buffer delays in an integrated circuit design, said integrated circuit design comprising a semiconductor substrate, a plurality of metal routing layers layered over said substrate, a plurality of dielectric layers sandwiched between said plurality of metal routing layers, said method comprising:

determining a location on said integrated circuit for a clock driver block;

implementing a clock driver within said clock driver block, said clock driver having a clock driver input, a clock driver output, a plurality of clock buffers connectable in series between said clock driver input and said clock driver output, each said plurality of clock buffers having a respective clock buffer input and a respective clock buffer output;

within said clock buffer block, partitioning one or more of said plurality of metal routing layers into one or more programming layers and one or more non-programming layers;

for a first clock buffer in said plurality of clock buffers in said clock driver, mapping an input route between said clock driver input and said respective clock buffer input through one or more of said plurality of metal routing layers;

for each clock buffer in said clock driver, mapping an output route between said clock buffer output of said respective clock buffer to said clock driver output through one or more of said non-programming layers and one or more of said programming layers;

for each clock buffer except a last one of said plurality of clock buffers in said clock driver, mapping a series route between said clock buffer output of said respective clock buffer to said respective clock buffer input of a next one of said clock buffers in said clock driver through one or more of said non-programming layers and one or more of said programming layers;

for said first clock buffer in said plurality of clock buffers in said clock driver, implementing metal corresponding to said mapped input route on each of said one or more of said plurality of metal routing layers;

for each clock buffer in said clock driver, implementing metal corresponding to said mapped output route on each of said one or more of said non-programming layers;

for each clock buffer in said clock driver except said last one of said plurality of clock buffers in said clock driver, implementing metal corresponding to said mapped series route on each of said one or more of said non-programming layers;

obtaining a desired clock driver delay for said clock driver;

selecting a sequence of one or more of said plurality of clock buffers in said clock driver which, if connected in series, would result in said desired clock driver delay, wherein a first clock buffer in said sequence comprises said first clock buffer in said plurality of clock buffers in said clock driver; and implementing metal corresponding to said respective mapped output route of a last selected clock buffer in said selected sequence of clock buffers on each of said one or more of said programming layers; and for each clock buffer in said selected sequence of buffers preceding said last selected clock buffer, implementing metal corresponding to said respective mapped series route on each of said one or more of said programming layers.

2. A method in accordance with claim 1, wherein:

said programming layers comprises a single programming layer.

3. A method in accordance with claim 1, comprising:

obtaining a new desired clock driver delay for said clock driver;

selecting a new sequence of one or more of said plurality of clock buffers in said clock driver which, if connected in series, would result in said new desired clock driver delay, wherein a first clock buffer in said new sequence comprises said first clock buffer in said plurality of clock buffers in said clock driver; and implementing metal corresponding to said respective mapped output route of a last selected clock buffer in said new selected sequence of clock buffers on each of said one or more of said programming layers; and for each clock buffer in said new selected sequence of clock buffers preceding said last selected clock buffer, implementing metal corresponding to said respective mapped series route on each of said one or more of said programming layers.

4. A method in accordance with claim 3, wherein:

said programming layers comprises a single programming layer.

5. A method in accordance with claim 1, comprising:

for each clock buffer following said first one of said plurality of clock buffers in said clock driver, mapping a static route between said clock buffer input of said respective clock buffer to a static line in said integrated circuit through one or more of said non-programming layers and one or more of said programming layers;

for each clock buffer in said clock driver following said first one of said plurality of clock buffers in said clock driver, implementing metal corresponding to said mapped static route on each of said one or more of said non-programming layers; and for each clock buffer in said clock driver not included I said selected sequence of clock buffers, implementing metal corresponding to said respective mapped static route on each of said one or more of said programming layers.

6. A method in accordance with claim 5, wherein:

said programming layers comprises a single programming layer.

7. A method in accordance with claim 5, comprising:

obtaining a new desired clock driver delay for said clock driver;

selecting a new sequence of one or more of said plurality of clock buffers in said clock driver which, if connected in series, would result in said new desired clock driver delay, wherein a first clock buffer in said new sequence comprises said first clock buffer in said plurality of clock buffers in said clock driver; and implementing metal corresponding to said respective mapped output route of a last selected clock buffer in said new selected sequence of clock buffers on each of said one or more of said programming layers; and for each clock buffer in said new selected sequence of clock buffers preceding said last selected clock buffer, implementing metal corresponding to said respective mapped series route on each of said one or more of said programming layers.

8. A method in accordance with claim 7, wherein:

said programming layers comprises a single programming layer.

9. A method in accordance with claim 1, wherein:

for each clock buffer following said first one of said plurality of clock buffers in said clock driver, mapping a static route between said clock buffer input of said respective clock buffer to a static line in said integrated circuit through one or more of said non-programming layers and one or more of said programming layers;

for each clock buffer in said clock driver following said first one of said plurality of clock buffers in said clock driver, implementing metal corresponding to said mapped static route on each of said one or more non-programming layers;

for a first clock buffer in said clock driver, if any, not included in said selected sequence of clock buffers, implementing metal corresponding to said respective mapped static route on each of said one or more programming layers; and for each clock buffer, if any, in said clock driver not included in said selected sequence of clock buffers following said first clock buffer in said clock driver not included in said selected sequence of clock buffers, implementing metal corresponding to said respective mapped series route on each of said one or more programming layers.

10. A method in accordance with claim 9, wherein:

said programming layers comprises a single programming layer.

11. A method in accordance with claim 9, comprising:

obtaining a new desired clock driver delay for said clock driver;

selecting a new sequence of one or more of said plurality of clock buffers in said clock driver which, if connected in series, would result in said new desired clock driver delay, wherein a first clock buffer in said new sequence comprises said first clock buffer in said plurality of clock buffers in said clock driver; and implementing metal corresponding to said respective mapped output route of a last selected clock buffer in said new selected sequence of clock buffers on each of said one or more of said programming layers; and for each clock buffer in said new selected sequence of clock buffers preceding said last selected clock buffer, implementing metal corresponding to said respective mapped series route on each of said one or more of said programming layers.

12. A method in accordance with claim 11, wherein:

said programming layers comprises a single programming layer.

13. A programmable integrated circuit design for an integrated circuit which allows in-place programming of a clock buffer delay of a clock driver, said integrated circuit design comprising:

a semiconductor substrate;

a plurality of metal routing layers layered over said substrate;

a plurality of dielectric layers sandwiched between said plurality of metal routing layers;

a clock driver located within a fixed clock driver block, said clock driver comprising a clock driver input, a clock driver output, and a plurality of clock buffers connectable in series between said clock driver input and said clock driver output, each said plurality of clock buffers having a respective clock buffer input and a respective clock buffer output;

within said clock buffer block, one or more designated non-programming layers from said plurality of metal routing layers;

within said clock buffer block, one or more designated programming layers from said plurality of metal routing layers;

metal implemented on one or more of said metal routing layers within said clock driver block connecting said clock driver input to a clock buffer input of a respective first one of said plurality of clock buffers in said clock driver;

for each clock buffer in said clock driver, a mapped output route mapping an output route between said clock buffer output of said respective clock buffer to said clock driver output through one or more of said non-programming layers and one or more of said programming layers;

for each clock buffer except a last one of said plurality of clock buffers in said clock driver, a mapped series route mapping a series route between said clock buffer output of said respective clock buffer to said respective clock buffer input of a next one of said clock buffers in said clock driver through one or more of said non-programming layers and one or more of said programming layers;

metal implemented on each of said one or more of said non-programming layers corresponding to said respective mapped output route of each of said plurality of clock buffers in said clock driver;

metal implemented on each of said one or more of said non-programming layers corresponding to said respective mapped series route of each of said clock buffers except said last one of said plurality of clock buffers in said clock driver;

metal implemented on each of said one or more of said programming layers corresponding to said respective mapped output route of a selected one of said plurality of clock buffers in said clock driver; and metal implemented on each of said one or more programming layers of said corresponding to said respective mapped series route of each of said clock buffers, if any, preceding said selected one of said plurality of clock buffers in said clock driver.

14. A programmable integrated circuit design in accordance with claim 13, wherein:

said one or more programmable layers comprise a single metal layer.

15. A programmable integrated circuit design in accordance with claim 13, wherein:

a clock driver delay generated by said one or more clock buffers connected in series between said clock driver input and said clock driver output is adjustable by reprogramming metal connections in said one or more programming layers.

16. A programmable integrated circuit design in accordance with claim 14, wherein:

said one or more programmable layers comprise a single metal layer.

17. A programmable integrated circuit design in accordance with claim 13, comprising:

for each clock buffer except a first one of said plurality of clock buffers in said clock driver, a mapped static route mapping a static route between said clock buffer input of said respective clock buffer to a static line in said integrated circuit through one or more of said non-programming layers and one or more of said programming layers;

metal implemented on each of said one or more non-programming layers corresponding to said respective mapped static route for each clock buffer in said clock driver except said first one of said plurality of clock buffers in said clock driver; and metal implemented on each of said one or more programming layers corresponding to said respective mapped static route for each clock buffer in said clock driver except said first one of said plurality of clock buffers in said clock driver.

18. A programmable integrated circuit design in accordance with claim 13, wherein:

said one or more programmable layers comprise a single metal layer.

19. A method in accordance with claim 13, wherein:

for each clock buffer except a first one of said plurality of clock buffers in said clock driver, a mapped static route mapping a static route between said clock buffer input of said respective clock buffer to a static line in said integrated circuit through one or more of said non-programming layers and one or more of said programming layers;

metal implemented on each of said one or more non-programming layers corresponding to said respective mapped static route for each clock buffer in said clock driver except said first one of said plurality of clock buffers in said clock driver;

metal implemented on each of said one or more programming layers corresponding to said respective mapped static route for said first clock buffer following said selected clock buffer in said clock driver, if it exists; and metal implemented on each of said one or more programming layers corresponding to said respective mapped series route for each clock buffer subsequent to said first clock buffer following said selected clock buffer.

20. A programmable integrated circuit design in accordance with claim 19, wherein:

said one or more programmable layers comprise a single metal layer.

* * * * *